United States Patent
Peng et al.

(10) Patent No.: US 7,145,172 B2
(45) Date of Patent: Dec. 5, 2006

(54) THIN FILM TRANSISTOR ARRAY SUBSTRATE

(75) Inventors: Chih-Yu Peng, Hsinchu (TW);
Wei-Chuan Lin, Taipei (TW);
Chian-Chih Hsiao, Taipei Hsien (TW);
Ta-Ko Chuang, Taichung (TW);
Chun-Hung Chu, Feng Yuan (TW);
Chih-Lung Lin, Taichung (TW);
Chin-Mao Lin, Chiayi (TW)

(73) Assignee: Hannstar Display Corporation, Taipei (TW)

( * ) Notice: Subject to any disclaimer, the term of this patent is extended or adjusted under 35 U.S.C. 154(b) by 299 days.

(21) Appl. No.: 10/932,828

(22) Filed: Sep. 2, 2004

(65) Prior Publication Data

US 2005/0023533 A1 Feb. 3, 2005

Related U.S. Application Data (62) Division of application No. 10/289,470, filed on Nov. 6, 2002, now Pat. No. 6,800,510.

(51) Int. Cl.
*H01L 31/0376* (2006.01)
*H01L 21/00* (2006.01)

(52) U.S. Cl. ............... 257/52; 257/59; 257/646; 257/E31.047; 257/E31.062; 257/E29.08; 438/151

(58) Field of Classification Search .............. None
See application file for complete search history.

(56) References Cited

U.S. PATENT DOCUMENTS

| | | | |
|---|---|---|---|
| 5,374,570 A | 12/1994 | Nasu et al. .............. 438/30 |
| 5,905,274 A | 5/1999 | Ahn et al. | |
| 5,917,564 A | 6/1999 | Kim et al. | |
| 6,133,967 A | 10/2000 | Moon | |
| 6,218,221 B1 | 4/2001 | Sah | |
| 6,485,997 B1 | 11/2002 | Lee et al. | |
| 6,649,933 B1 | 11/2003 | Wong | |
| 6,746,905 B1 | 6/2004 | Fukuda .............. 438/164 |
| 6,790,714 B1 | 9/2004 | Hirano et al. .............. 438/149 |
| 6,791,144 B1 | 9/2004 | Fryer et al. .............. 257/349 |
| 6,800,510 B1 * | 10/2004 | Peng et al. .............. 438/149 |
| 6,953,715 B1 | 10/2005 | Peng et al. .............. 438/149 |
| 7,087,469 B1 * | 8/2006 | Peng et al. .............. 438/151 |

FOREIGN PATENT DOCUMENTS

KR        2001004020 A    *   1/2001

* cited by examiner

*Primary Examiner*—Alonzo Chambliss (57) ABSTRACT

A thin film transistor array substrate of a thin film transistor liquid crystal display (TFT-LCD) is provided. The gate dielectric layer of the TFT includes a silicon nitride layer, a dielectric layer and a silicon nitride layer, and the etching selectivity of the amorphous silicon layer over the dielectric layer is not less than about 5.0. Therefore, the dielectric layer can be an etching stop layer when doped and undoped amorphous silicon layers are etched to form source/drain stacked layers or a conductive layer is etched to form a gate on the gate dielectric layer. Hence, the dielectric layer thickness can be controlled, and thereby the capacitance of the storage capacitor can be controlled.

20 Claims, 6 Drawing Sheets

THIN FILM TRANSISTOR ARRAY SUBSTRATE

RELATED APPLICATIONS

This application is a divisional application of U.S. application Ser. No. 10/289,470, filed Nov. 6, 2002 now U.S. Pat. No. 6,800,510, the full disclosure of which is incorporated herein by reference.

BACKGROUND OF INVENTION

1. Field of Invention

The present invention relates to a thin film transistor array substrate of a thin film transistor liquid crystal display (TFT-LCD). More particularly, the present invention relates to controlling the capacitance of a TFT-LCD storage capacitor.

2. Description of the Related Art

Liquid crystal display (LCD) has many advantages over other conventional types of displays including high display quality, small volume occupation, lightweight, low voltage driven and low power consumption. Hence, LCDs are widely used in small portable televisions, mobile telephones, video recording units, notebook computers, desktop monitors, projector televisions and so on. Therefore, LCD has gradually replaced the conventional cathode ray tube (CRT) as a mainstream display unit.

The gate dielectric layer of the thin film transistor in the TFT-LCD is generally a silicon nitride layer. When a source/drain stacked layer in a bottom gate structure or a gate in a top gate structure is formed on the gate dielectric layer, a short period of over-etching is performed to make sure that no residues are left on the gate dielectric layer. Since the area of the transparent substrate is very large, the thickness uniformity of the gate dielectric layer after over-etching on the entire transparent substrate is not good. Thus, the thickness uniformity of the storage capacitor dielectric layer in each pixel is also affected.

The storage electricity of the storage capacitor is used to compensate for the leakage current of the pixel electrode, and the pixel electrode voltage can therefore be maintained at a stable level to stabilize the arrangement of liquid crystal molecules to stabilize the display of LCD. If the capacitances of the capacitors on the transparent substrate are varied, the charging or discharging rates are also varied. Therefore, the TFT dimensions cannot be designed according to the ideal condition that each storage capacitor has the same capacitance. To insure that a storage capacitor with less sufficient capacitance can normally charge and discharge in a regular time period, the TFT dimensions have to be designed large enough to enable the poorest storage capacitor to function normally. Therefore, the stability of the TFT-LCD display can be maintained. However, the aperture ratio of each pixel in TFT-LCD is decreased.

SUMMARY OF CERTAIN INVENTIVE ASPECTS

One aspect of the invention provides a method of controlling the capacitance of the TFT-LCD storage capacitor to control the uniformity of the storage capacitor's dielectric layer.

Another aspect of the invention provides a method of controlling the capacitance of the TFT-LCD storage capacitor to improve the uniformity of the storage capacitor's capacitance.

2

Another aspect of the invention provides a method of controlling the capacitance of the TFT-LCD storage capacitor to reduce TFTs' dimensions.

Still another aspect of the invention provides a method of controlling the capacitance of the TFT-LCD storage capacitor to elevate the aperture ratio of the liquid crystal display.

In one embodiment, a method of controlling the capacitance of the TFT-LCD storage capacitor is provided. The method comprises the following steps. A first conductive layer is formed on a transparent substrate and then is patterned to form a gate and a bottom electrode. A first silicon nitride layer, a dielectric layer, a second silicon nitride layer, an undoped amorphous silicon layer, and a doped amorphous silicon layer are sequentially formed on the transparent substrate, and an etching selectivity ratio of amorphous silicon over a material of the dielectric layer is not less than about 5.0. The doped amorphous silicon layer, the undoped amorphous silicon layer, and the second silicon nitride layer are patterned to form a stacked layer on the dielectric layer over the gate. A second conductive layer is formed on the transparent substrate. Then, the second conductive layer and the doped amorphous silicon layer are patterned to form a source and a drain on either side of the gate. Next, a passivation layer is formed over the transparent substrate and then is patterned to form a contact window to expose the source or the drain. A transparent conductive layer is formed on the passivation layer and in the contact window. The transparent conductive layer then is patterned to form a pixel electrode to connect the exposed source or the drain through the contact window electrically, and a storage capacitor is formed by the overlap between the pixel electrode and the bottom electrode.

In another embodiment, a method of controlling the capacitance of the TFT-LCD storage capacitor is provided. The method comprises the following steps. A first conductive layer is formed on a transparent substrate and then is patterned to form a gate and a bottom electrode on the transparent substrate. A first silicon nitride layer, a dielectric layer, a second silicon nitride layer, an undoped amorphous silicon layer, and an etching stop layer are sequentially formed on the transparent substrate, and an etching selectivity ratio of amorphous silicon over a material of the dielectric layer is not less than about 5.0. The etching stop layer is patterned to form an etching mask on the undoped amorphous silicon layer over the gate. A doped amorphous silicon layer and a second conductive layer are sequentially formed over the transparent substrate. Then, the second conductive layer, the doped amorphous silicon layer, the undoped amorphous silicon layer, and the second silicon nitride layer are sequentially patterned to form a source and a drain on either side of the gate, and the undoped amorphous silicon layer serves as a channel between the source and the drain. A passivation layer is formed over the transparent substrate and then is patterned to form a contact window therein to expose the source or the drain. A transparent conductive layer is formed on the passivation layer and in the contact window. Then, the transparent conductive layer is patterned to form a pixel electrode to connect the exposed source or drain electrically through the contact window, and a storage capacitor is formed by the overlap between the pixel electrode and the bottom electrode.

In still another embodiment, a method of controlling the capacitance of the TFT-LCD storage capacitor is provided. The method comprises the following steps. An undoped amorphous silicon layer is formed on a transparent substrate and then is patterned to form a silicon island of the TFT and a bottom electrode of the storage capacitor on the transparent substrate. A first silicon nitride layer, a dielectric layer, a second silicon nitride layer, and a first conductive layer are sequentially formed on the transparent substrate, and an etching selectivity ratio of amorphous silicon over a material of the dielectric layer is not less than about 5.0. Then, the first conductive layer and the second silicon nitride layer are patterned to form a stacked layer on the central part of the silicon island, and the first conductive layer of the stacked layer serves as a gate of a thin film transistor. The gate is used as a mask to implant ions into the silicon island under both sides of the gate to form a source and a drain of the thin film transistor and implant ions into the bottom electrode. A passivation layer is formed over the transparent substrate. The passivation layer, the dielectric layer and the first silicon nitride layer then are patterned to form a first contact window to expose the source and a second contact window to expose the drain. A second conductive layer is formed over the transparent substrate and then is patterned to form a data line connecting the source through the first contact window. A transparent conductive layer is formed over the transparent substrate. The transparent conductive layer is patterned to form a pixel electrode connecting the drain through the second contact window, and a storage capacitor is formed by the overlap between the pixel electrode and the bottom electrode.

In various embodiments, the dielectric layer is, for example, a silicon oxide layer, a tantalum oxide layer, an aluminum oxide layer or a barium titanate layer.

Various inventive embodiments allow the dielectric layer to be an etch stop layer when the stacked layer is formed, and the remaining dielectric layer and the first silicon nitride layer thus have a uniform thickness. Therefore, the storage capacitor, which comprises overlapping parts of the bottom electrode, the first silicon nitride layer, the dielectric layer, the passivation layer and the pixel electrode, has a uniform dielectric layer, which comprises the first silicon nitride layer, the dielectric layer, and the passivation layer. As a result, the capacitance of the storage capacitor is also uniform to allow a smaller dimension of the thin film transistor. Hence, the aperture ratio of each pixel is increased to improve the display quality.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of various embodiments of the invention, and are incorporated in and constitute a part of this specification. The drawings illustrate embodiments of the invention and, together with the description, serve to explain certain inventive aspects of the invention. In the drawings.

DESCRIPTION OF CERTAIN EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

As described above, this invention provides a method of controlling the capacitance of the TFT-LCD storage capacitor. This method controls the thickness uniformity of the storage capacitor's dielectric layer and thereby the effects of increasing uniformity of the storage capacitor's capacitance, reducing the dimensions of TFT, and increasing the aperture ratio of the LCD are reached.

Embodiment 1

Figure 1A:
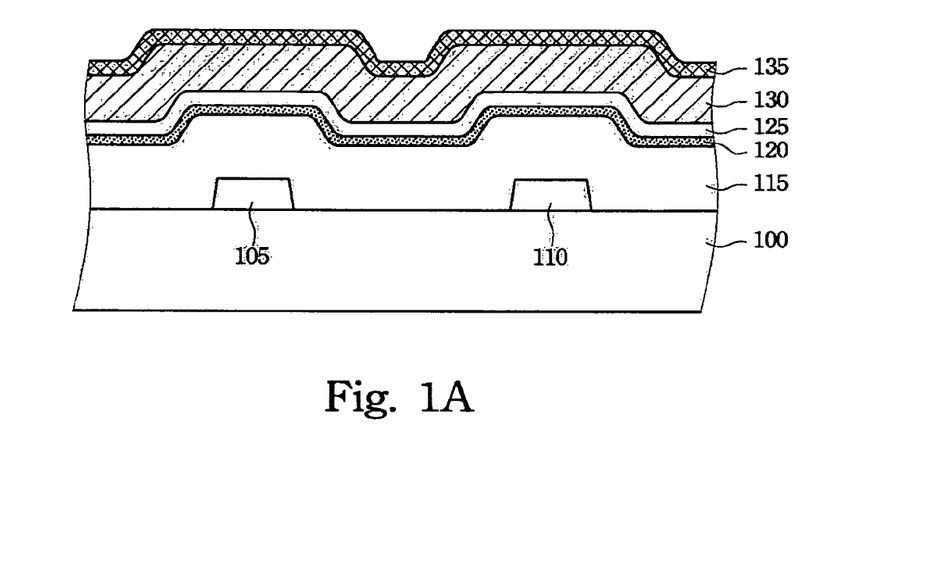
FIGS. 1A–1D are schematic, cross-sectional views showing a process for controlling the capacitance of the TFT-LCD storage capacitor according to one preferred embodiment of this invention.

FIGS. 1A–1D are schematic, cross-sectional views showing a process for controlling the capacitance of the TFT-LCD storage capacitor according to a first preferred embodiment of this invention. In FIG. 1A, a first conductive layer is formed on a transparent substrate 100 and then is patterned to form a gate 105 and a bottom electrode 110 respectively on the transparent substrate 100. Then, a first silicon nitride layer 115, a dielectric layer 120, a second silicon nitride layer 125, an undoped amorphous silicon layer 130, and a doped amorphous silicon layer 135 are sequentially formed on the transparent substrate.

The material of the first conductive layer is, for example, copper, aluminum, chromium or alloy of molybdenum and tungsten, and the first conductive layer can be formed by a physical vapor deposition process such as sputtering. The first silicon nitride layer 115 and the second silicon nitride layer 125 can be formed by chemical vapor deposition; the preferable thicknesses of the first silicon nitride layer 115 and the second silicon nitride layer 125 are respectively about 1500–3500 Å and about 200–800 Å, and their more preferable thicknesses are respectively about 2000–3000 Å and about 400–600 Å. An etching selectivity ratio of amorphous silicon over the material of the dielectric layer 120 is not less than about 5.0. The material of the dielectric layer 120 is, for example, silicon oxide or dielectric material, such as tantalum oxide, aluminum oxide or barium titanate, having a dielectric constant larger than about 4.0. The dielectric layer 120 is formed by chemical vapor deposition; its preferable thickness is about 100–600 Å, and its more preferable thickness is about 200–400 Å.

Figure 1B:
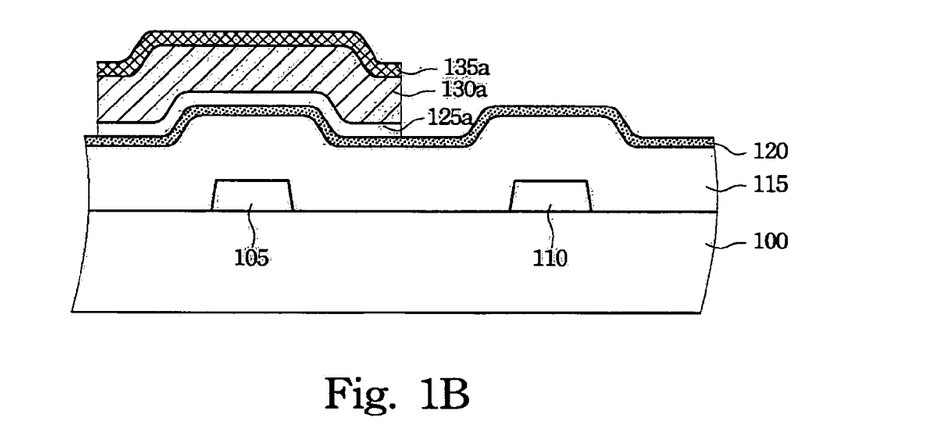

In FIG. 1B, the doped amorphous silicon layer 135, the undoped amorphous silicon layer 130, and the second silicon nitride layer 125 are patterned to form a stacked layer on the dielectric layer 120 over the gate 105. The stacked layer comprises the doped amorphous silicon layer 135a, the undoped amorphous silicon layer 130a, and the second silicon nitride layer 125a. The patterning method is, for example, lithography and etching.

Figure 1C:
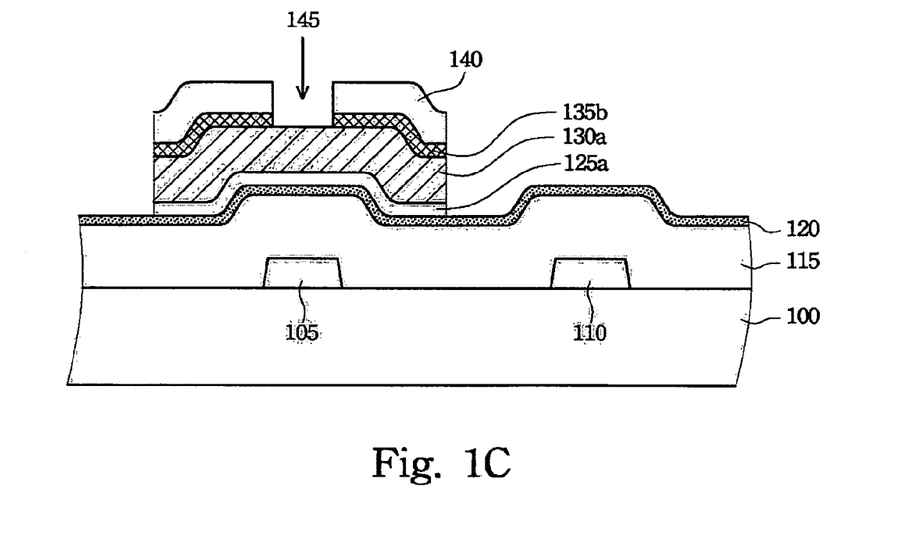

In FIG. 1C, a second conductive layer is formed on the transparent substrate 100. Then, the second conductive layer is patterned to form source/drains 140 over both sides of the gate 105. Then, the doped amorphous silicon layer 135a exposed by opening 145 is etched to form lightly doped drains 135b. The material of the second conductive layer is, for example, copper, aluminum, chromium or alloy of molybdenum and tungsten, and the second conductive layer is formed by a physical vapor deposition process such as sputtering.

Figure 1D:
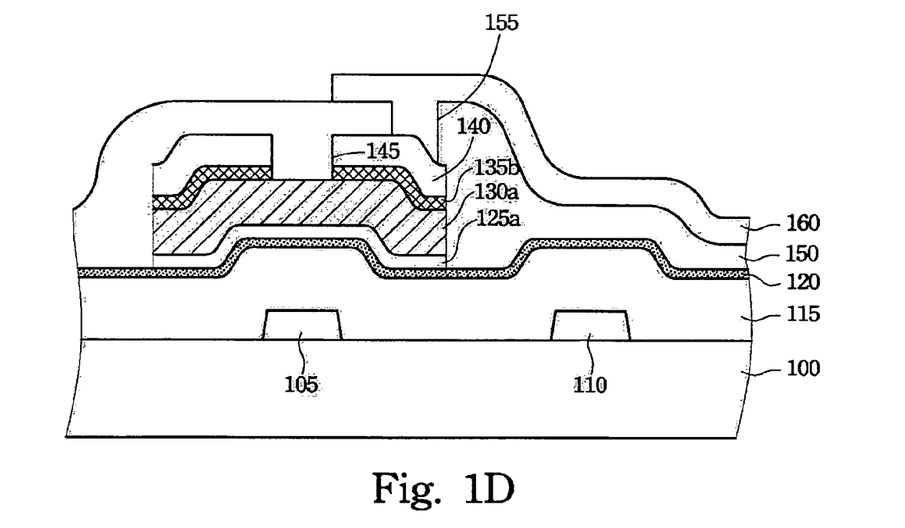

In FIG. 1D, a passivation layer 150 is formed over the transparent substrate 100 and then is patterned to form a contact window 155 to expose the source/drain 140 on the right side. A transparent conductive layer is formed on the passivation layer 150 and in the contact window 155. The transparent conductive layer then is patterned to form a pixel electrode 160 to connect the exposed source/drain 140 through the contact window 155 electrically. A storage capacitor of the thin film transistor is formed by the overlap between the pixel electrode 160 and the bottom electrode 110, and hence the storage capacitor's dielectric layer includes the passivation layer 150, the dielectric layer 120, and the first silicon nitride layer 115 between the pixel electrode 160 and the bottom electrode 110. The material of the above-mentioned transparent conductive layer is, for example, indium tin oxide or indium zinc oxide, and the transparent conductive layer is formed by, for example, a physical vapor deposition process such as reactive sputtering.

Embodiment 2

Figure 2A:
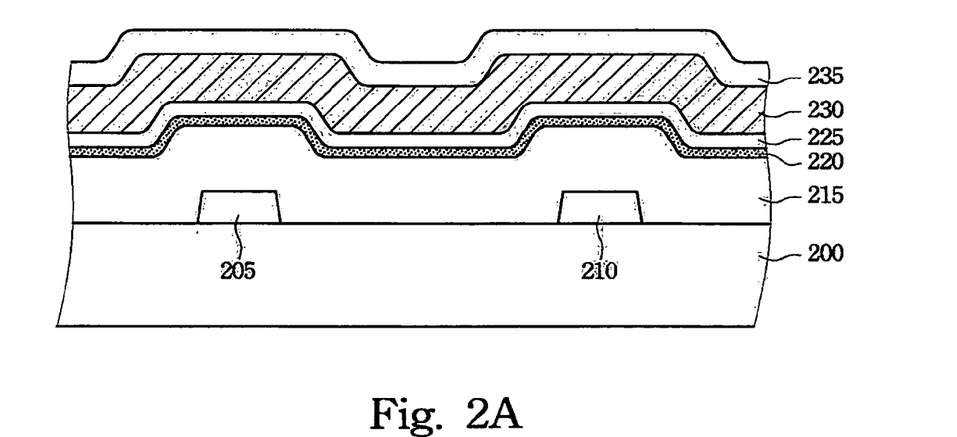
FIGS. 2A–2C are schematic, cross-sectional views showing a process for controlling the capacitance of the TFT-LCD storage capacitor according to another preferred embodiment of this invention.
Figure 2B:
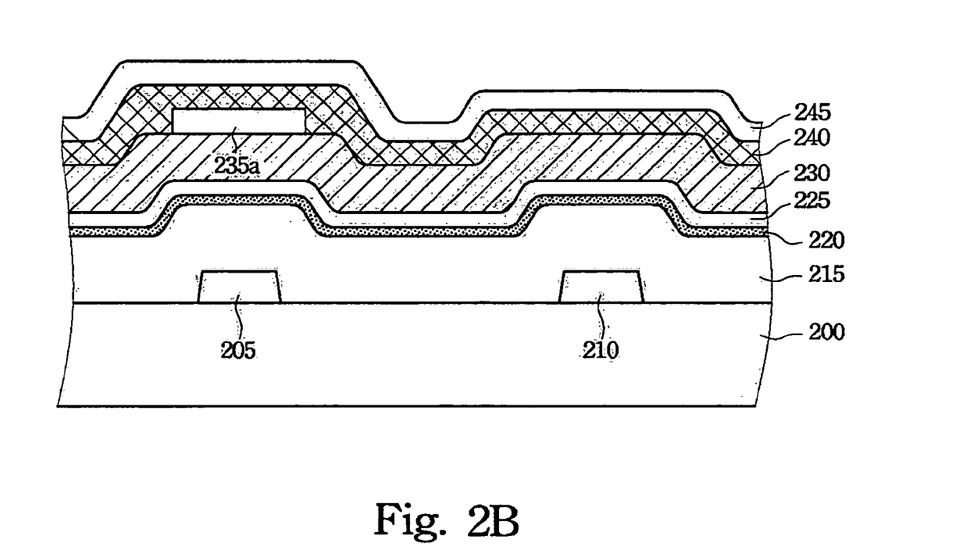
Figure 2C:
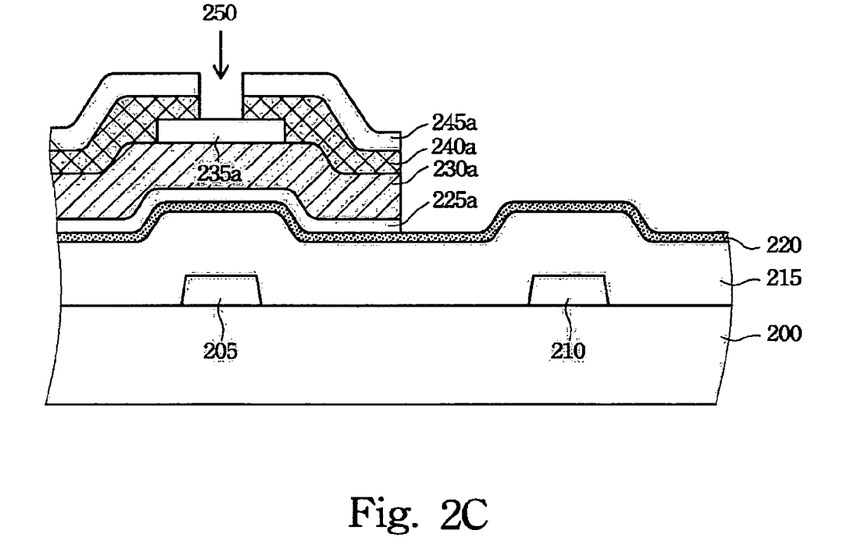

FIGS. 2A–2C are schematic, cross-sectional views showing a process for controlling the capacitance of the TFT-LCD storage capacitor according to a second Is preferred embodiment of this invention. In FIG. 2A, a first conductive layer is formed on a transparent substrate 200 and then is patterned to form a gate 205 and a bottom electrode 210 on the transparent substrate 200. A first silicon nitride layer 215, a dielectric layer 220, a second silicon nitride layer 225, an undoped amorphous silicon layer 230, and an etching stop layer 235 are sequentially formed on the transparent substrate 200.

The material of the first conductive layer is, for example, copper, aluminum, chromium or alloy of molybdenum and tungsten, and the first conductive layer is formed by a physical vapor deposition process such as sputtering. The first silicon nitride layer 215 and the second silicon nitride layer 225 is formed by chemical vapor deposition; the preferable thicknesses of the first silicon nitride layer 215 and the second silicon nitride layer 225 are respectively about 1500–3500 Å and about 200–800 Å, and their more preferable thicknesses are respectively about 2000–3000 Å and about 400–600 Å. An etching selectivity ratio of amorphous silicon over the material of the dielectric layer 220 is not less than about 5.0. The material of the dielectric layer 220 is, for example, silicon oxide or dielectric material, such as tantalum oxide, aluminum oxide or barium titanate, having a dielectric constant larger than about 4.0. The dielectric layer 220 is formed by chemical vapor deposition; its preferable thickness is about 100–600 Å, and its more preferable thickness is about 200–400 Å. The etching stop layer 235 is formed by chemical vapor deposition, and it is, for example, a silicon nitride layer or a silicon oxide/silicon nitride composite layer. The preferable thickness of the etching stop layer 235 is about 200–400 Å.

In FIG. 2B, the etching stop layer 235 is patterned to form an etching mask 235a on the undoped amorphous silicon layer 230 over the gate 205. Then, a doped amorphous silicon layer 240 and a second conductive layer 245 are sequentially formed over the transparent substrate 200. The material of the second conductive layer 245 is, for example, copper, aluminum, chromium or alloy of molybdenum and tungsten, and the second conductive layer is formed by a physical vapor deposition process such as sputtering.

In FIG. 2C, the second conductive layer 245, the doped amorphous silicon layer 240, the undoped amorphous silicon layer 230, and the second silicon nitride layer 225 are sequentially patterned to form a stacked layer and an opening 250 in the stacked layer. The stacked layer comprises a second silicon nitride layer 225a, a channel 230a, two lightly doped drain 240a, and two source/drains 245a. Since the etching mask 235a protects the undoped amorphous silicon layer 230a, the etching to form opening 250 can stop on the etching mask 235a to avoid damaging the undoped amorphous silicon layer 230a. The patterning method mentioned above is, for example, lithography and etching. The following processes are similar to those of Embodiment 1 and hence are omitted here.

Embodiment 3

Figure 3A:
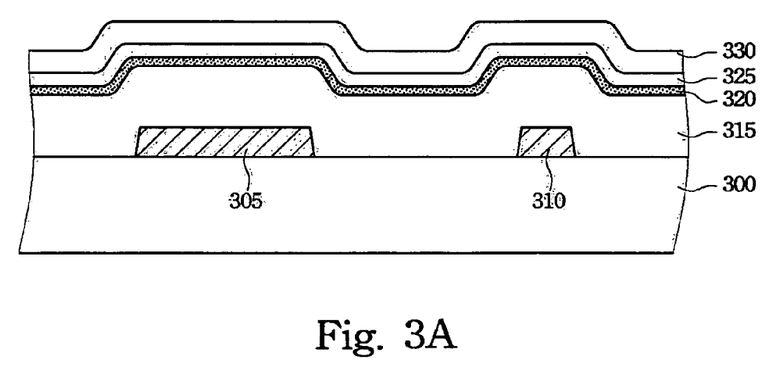
FIGS. 3A–3C are schematic, cross-sectional views showing a process for controlling the capacitance of the TFT-LCD storage capacitor according to still another preferred embodiment of this invention.
Figure 3B:
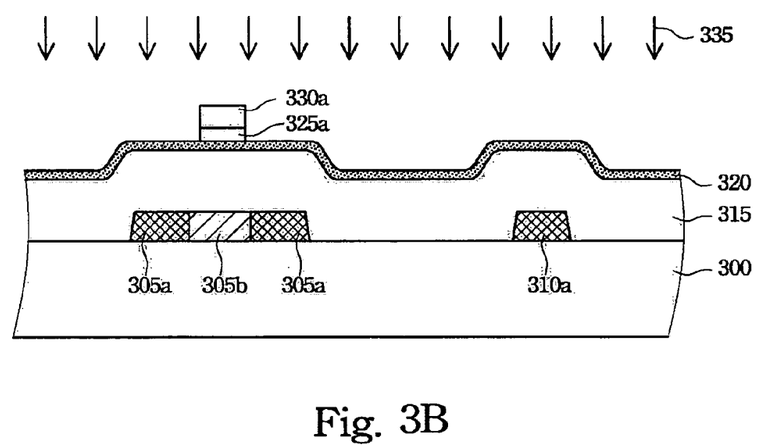
Figure 3C:
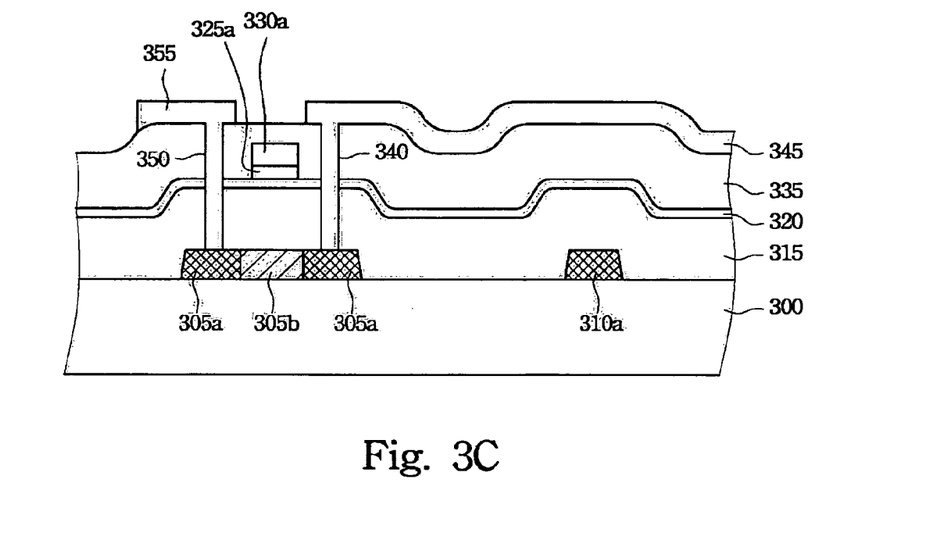

FIGS. 3A–3C are schematic, cross-sectional views showing a process of controlling the capacitance of the TFT-LCD storage capacitor according to a third preferred embodiment of this invention. In FIG. 3A, an undoped amorphous silicon layer is formed on a transparent substrate 300 and then is patterned to form a silicon island 305 and a bottom electrode 310 on the transparent substrate 300. A first silicon nitride layer 315, a dielectric layer 320, a second silicon nitride layer 325, and a first conductive layer 330 are sequentially formed on the transparent substrate 300.

The first silicon nitride layer 315 and the second silicon nitride layer 325 is formed by chemical vapor deposition; the preferable thicknesses of the first silicon nitride layer 315 and the second silicon nitride layer 325 are respectively about 1500–3500 Å and about 200–800 Å, and their more preferable thicknesses are respectively about 2000–3000 Å and about 400–600 Å. An etching selectivity ratio of the material of amorphous silicon over the dielectric layer 320 is not less than about 5.0. The material of the dielectric layer 320 is, for example, silicon oxide or a dielectric material, such as tantalum oxide, aluminum oxide or barium titanate, having a dielectric constant larger than about 4.0. The dielectric layer 320 is formed by chemical vapor deposition; its preferable thickness is about 100–600 Å, and its more preferable thickness is about 200–400 Å. The material of the first conductive layer is, for example, copper, aluminum, chromium or alloy of molybdenum and tungsten, and the first conductive layer is formed by a physical vapor deposition process such as sputtering.

In FIG. 3B, the first conductive layer 330 and the second silicon nitride layer 325 are patterned to form a stacked layer comprising a second silicon nitride layer 325a and a gate 330a on the central part of the silicon island 305. Then, the gate 330a is used as a mask to implant ions into the silicon island 305 under both sides of the gate 330a and the bottom electrode 310 to form two source/drains 305a, channel 305b of the thin film transistor and the bottom electrode 310a.

In FIG. 3C, a passivation layer 335 is formed over the transparent substrate 300, and the passivation layer 335, the dielectric layer 320 and the first silicon nitride layer 315 then are patterned to form contact windows 340 and 350 to expose both of the source/drains 305a. Next, a second conductive layer is formed over the transparent substrate and is patterned to form a data line 355 connecting the source/drain 305a on the left side through the contact window 350. A transparent conductive layer is formed over the transparent substrate 300. The transparent conductive layer is patterned to form a pixel electrode 345 connecting the source/drain 305a on the right side through the contact window 340. A storage capacitor of the thin film transistor is formed by the overlap between the pixel electrode 345 and the bottom electrode 310a, and hence the storage capacitor's dielectric layer includes the passivation layer 335, the dielectric layer 320, and the first silicon nitride layer 315 between the pixel electrode 345 and the bottom electrode 310a. The material of the above-mentioned transparent conductive layer is, for example, indium tin oxide or indium zinc oxide, and the transparent conductive layer is, for example, a physical vapor deposition process such as reactive sputtering.

From the preferred embodiments mentioned above, it is evident that the gate dielectric layer of the thin film transistor is replaced by the composite gate dielectric layer comprising the first silicon nitride layer, the dielectric layer and the second silicon nitride layer in this invention. Therefore, when the undoped amorphous silicon layer/doped amorphous silicon layer in the bottom gate design are etched to form the stacked layer or the conductive layer in the top gate design is etched to form the gate, the dielectric layer is used as an etching stop layer. Therefore, the thickness of the remaining gate dielectric layer over the entire transparent substrate is quite uniform after over-etching, and storage capacitors with uniform capacitance on the entire transparent substrate is obtained after the subsequent steps of depositing the passivation layer and forming the pixel electrodes.

The etching selectivity of an amorphous silicon layer over a silicon nitride layer is about 3.0–5.0, and the etching selectivity of an amorphous silicon layer over a silicon oxide layer is about 5.0–10.0. If the gate dielectric layer being a silicon nitride layer compares with the gate dielectric layer comprising a first silicon nitride layer, a silicon oxide layer and a second silicon nitride layer in a bottom gate designed thin film transistor, the result after over-etching is as follows. In the case where the gate dielectric layer is a silicon nitride layer, the thickness uniformity is about 5% over entire transparent substrate after depositing the silicon nitride layer by chemical vapor deposition; the thickness uniformity is reduced to about 20% after over-etching. However, in the case where the gate dielectric layer comprising a first silicon nitride layer, a silicon oxide layer and a second silicon nitride layer, the thickness uniformity is about 5% over the entire transparent substrate after depositing the first silicon nitride layer, the silicon oxide layer and the second silicon nitride layer by chemical vapor deposition; the thickness uniformity is still maintained at about 5% after over-etching. In addition, the thickness uniformity is also about 5% after depositing the passivation layer, and the storage capacitor's capacitance is maintained at a quite good uniformity over the entire transparent substrate.

Furthermore, if a dielectric layer with a dielectric constant larger than 4.0 is used, the storage capacitor's capacitance is increased. Therefore, the dimensions of the thin film transistor is further reduced to increase the aperture ratio of the liquid crystal display to improve the display quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thin film transistor array substrate of a thin film transistor liquid crystal display, comprising:
   a transparent substrate;
   a gate and a bottom electrode respectively located on the transparent substrate;
   a first silicon nitride layer formed on the transparent substrate, the gate, and the bottom electrode;
   a dielectric layer formed on the first silicon nitride layer;
   a stacked layer formed on the dielectric layer over the gate, the stacked layer comprising a second silicon nitride layer and an undoped amorphous silicon layer from the bottom to the top;
   two doped amorphous silicon layer portions serving as lightly doped drains respectively formed on the stacked layer over both sides of the gate;
   a source and a drain respectively formed on the two doped amorphous silicon layer portions;
   a passivation layer formed over the transparent substrate, and the passivation layer having a contact window exposing the drain; and
   a pixel electrode, formed on the passivation layer, connecting the drain through the contact window and overlapping with the bottom electrode,
   wherein an etching selectivity ratio of the undoped amorphous silicon layer and the two doped amorphous silicon layer portions over the dielectric layer is not less than about 5.0.

2. The thin film transistor array substrate of claim 1, wherein the dielectric layer comprises a silicon oxide layer.

3. The thin film transistor array substrate of claim 1, wherein the dielectric constant of the dielectric layer is greater than about 4.0.

4. The thin film transistor array substrate of claim 1, wherein the dielectric layer is one of a tantalum oxide layer, an aluminum oxide layer and a barium titanate layer.

5. The thin film transistor array substrate of claim 1, wherein the passivation layer comprises a silicon nitride layer.

6. The thin film transistor array substrate of claim 1, wherein the pixel electrode comprises indium tin oxide or indium zinc oxide.

7. The thin film transistor array substrate of claim 1, further comprising an etching mask formed between the two doped amorphous silicon layer portions and the stacked layer.

8. The thin film transistor array substrate of claim 7, wherein the etching mask comprises silicon nitride.

9. A thin film transistor array substrate of a thin film transistor liquid crystal display, comprising:
   a transparent substrate;
   a gate and a bottom electrode respectively located on the transparent substrate;
   a first silicon nitride layer formed on the transparent substrate, the gate, and the bottom electrode;
   a dielectric layer formed on the first silicon nitride layer;
   a stacked layer formed on the dielectric layer over the gate, the stacked layer comprising a second silicon nitride layer and an undoped amorphous silicon layer from the bottom to the top; and
   two doped amorphous silicon layer portions serving as lightly doped drains respectively located on the stacked layer over both sides of the gate,
   wherein an etching selectivity ratio of the undoped amorphous silicon layer and the two doped amorphous silicon layer portions over the dielectric layer is not less than about 5.0.

10. The thin film transistor array substrate of claim 9, further comprising:
    a source and a drain respectively formed on the two doped amorphous silicon layer portions;
    a passivation layer formed over the transparent substrate, and the passivation layer having a contact window exposing the drain; and
    a pixel electrode, formed on the passivation layer, connecting the drain through the contact window and overlapping with the bottom electrode.

11. The thin film transistor array substrate of claim 9, wherein the dielectric layer comprises a silicon oxide layer.

12. The thin film transistor array substrate of claim 11, wherein the dielectric constant of the dielectric layer is greater than about 4.0.

13. The thin film transistor array substrate of claim 9, wherein the dielectric layer is one of a tantalum oxide layer, an aluminum oxide layer and a barium titanate layer.

14. A thin film transistor array substrate of a thin film transistor liquid crystal display, comprising:
- a transparent substrate comprising a gate and a dielectric layer sequentially formed thereon;
- a stacked layer formed on the dielectric layer, the stacked layer comprising a silicon nitride layer and an undoped amorphous silicon layer; and
- two doped amorphous silicon layer portions serving as lightly doped drains respectively formed on the stacked layer over both sides of the gate,
- wherein an etching selectivity ratio of the undoped amorphous silicon layer and the two doped amorphous silicon layer portions over the dielectric layer is not less than about 5.0.

15. The thin film transistor array substrate of claim 14, wherein said transparent substrate further comprises:
- a bottom electrode; and
- another silicon nitride layer formed under the dielectric layer and on the transparent substrate, the gate, and the bottom electrode.

16. The thin film transistor array substrate of claim 15, further comprising:
- a source and a drain respectively formed on the two doped amorphous silicon layer portions;
- a passivation layer formed over the transparent substrate, and the passivation layer having a contact window exposing the drain; and
- a pixel electrode, located on the passivation layer, connecting the drain through the contact window and overlapping with the bottom electrode.

17. The thin film transistor array substrate of claim 16, wherein the passivation layer comprises a silicon nitride layer.

18. The thin film transistor array substrate of claim 16, wherein the pixel electrode comprises indium tin oxide or indium zinc oxide.

19. The thin film transistor array substrate of claim 14, further comprising an etching mask formed between the two doped amorphous silicon layer portions and the stacked layer.

20. The thin film transistor array substrate of claim 19, wherein the etching mask comprises silicon nitride.

* * * * *